United States Patent [19]

Dow et al.

[11] Patent Number: 5,478,773
[45] Date of Patent: Dec. 26, 1995

[54] METHOD OF MAKING AN ELECTRONIC DEVICE HAVING AN INTEGRATED INDUCTOR

[75] Inventors: Stephen Dow, Chandler; Eric C. Maass, Scottsdale; Bill Marlin, Phoenix, all of Ariz.

[73] Assignee: Motorola, Inc., Schaumburg, Ill.

[21] Appl. No.: 451,866

[22] Filed: May 26, 1995

Related U.S. Application Data

[62] Division of Ser. No. 234,203, Apr. 28, 1994.

[51] Int. Cl.⁶ .............................. H01L 21/70; H01L 27/00
[52] U.S. Cl. .............................. 437/60; 437/198; 437/230; 437/192
[58] Field of Search ................................ 437/230, 198, 437/60; 336/200; 257/531

[56] References Cited

U.S. PATENT DOCUMENTS

| | | | |
|---|---|---|---|
| 3,305,814 | 2/1967 | Moyer | 336/200 |
| 4,785,345 | 11/1988 | Rawls et al. | 336/200 |
| 5,070,317 | 12/1991 | Bhagat | 336/200 |
| 5,095,357 | 3/1992 | Andoh et al. | 336/200 |
| 5,111,169 | 5/1992 | Ikeda | 333/181 |
| 5,174,012 | 12/1992 | Hamilton | 204/192.22 |
| 5,384,274 | 1/1995 | Kanehadri | 437/47 |

FOREIGN PATENT DOCUMENTS

| | | |
|---|---|---|
| 6473658 | 3/1989 | Japan. |
| 2211987 | 7/1989 | United Kingdom. |
| 2269935 | 2/1994 | United Kingdom. |

*Primary Examiner*—George Fourson
*Assistant Examiner*—H. Jey Tsai
*Attorney, Agent, or Firm*—Aaron B. Bernstein

[57] ABSTRACT

An electronic device (10) comprises a copper integrated inductor (11) overlying other solid state components (31) of the device (10). Preferably, the copper inductor (11) is formed of plated copper to a thickness of several microns. The preferred integrated inductor (11) provides significant advantage over external inductors of the past with respect to simplicity of manufacture as well as system size and cost. Additionally, the preferred inductor (11) provides improved inductance per area, lower series resistance and higher Q values, relative to inductors of the past.

17 Claims, 1 Drawing Sheet

{ 5,478,773 }

METHOD OF MAKING AN ELECTRONIC DEVICE HAVING AN INTEGRATED INDUCTOR

This is a division of application Ser. No. 08/234,203, filed Apr. 28, 1994.

FIELD OF THE INVENTION

The present invention relates, in general, to electronic devices, land more particularly, to copper inductors associated with solid state devices.

BACKGROUND OF THE INVENTION

The communication field requires high frequency products for portable applications in the RF and microwave frequency ranges. The integrated circuits that help meet these needs generally require passive components such as capacitors and inductors for tuning, LC tanks, AC coupling, impedance matching, and filtering requirements. However, with regard to inductors, integrating inductors on the same substrate with active and/or passive components has been problematic. Conventional integrated inductors typically present high series resistance and substrate parasitic resulting in poor quality inductors (inductors with low Q, i.e., Q< 10). Consequently, passive components, including inductors, have typically been configured external to the integrated circuits containing the active components. Yet, external inductors present their own problems, including: requiring greater area/board space, introducing parasites associated with interfaces between integrated circuits and external components, lowering reliability due to more components and connections, and increasing cost due to higher component count and more complex assembly.

Where inductors have been integrated, the integrating has been accomplished using aluminum and gold metallization schemes with films typically less than 3 μm thick. These inductors suffer from high series resistance due to their thin structure, and the relatively high resistivity of aluminum and gold. In addition, integrated inductors used in the past have been implemented such that they do not lie over other components of the overall circuit, which are in lower layers of the device substrate. There are several reasons why, in the past inductors have not been incorporated over other components of the circuit. These reasons include increased substrate parasitics due to the typically thin dielectric layer between the integrated inductor and underlying electronic devices. Additionally, air bridges which are typically used to construct inductors (common in some GaAs technologies to support the inductor metal), do not permit the construction of devices Under the air bridge. Furthermore, integrated inductors have required etching material under the inductor to lower capacitive coupling. Such etching below the inductor does not permit the construction of devices Under the inductor.

Since inductors in the. past have not been incorporated over other electronic circuitry, separate area for the integrated inductors has been required. Separate area for the inductors increases the space required on the integrated circuit and thus the cost of the circuit. Depending on the integrated circuit technology, this additional area may make the integrated inductor cost prohibitive.

Consequently, a need exists for a method of constructing a high quality inductor on the same substrate as other active and/or passive components.

DETAILED DESCRIPTION OF THE DRAWINGS

Figure 1:
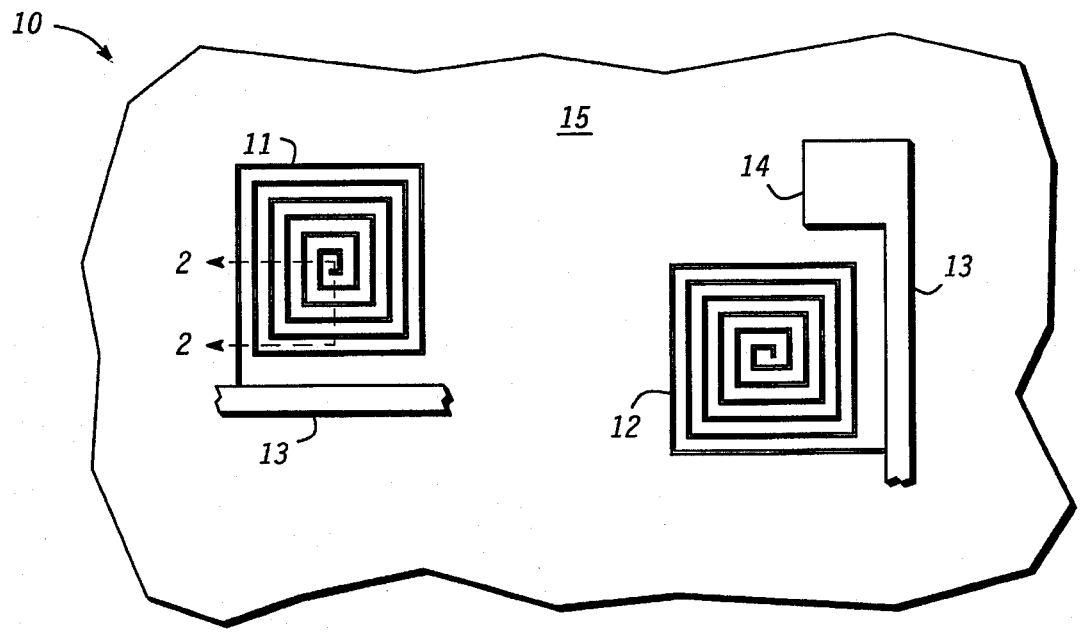
FIG. 1 is a simplified partial top view of an electronic device including integrated copper inductors.

Generally, in accordance with the preferred embodiment of the present invention, plated copper is used to form an integrated inductor which overlies other active components of the overall circuit. Plated copper is particularly advantageous relative to the aluminum and gold employed in,the past because aluminum and gold thicknesses are practically limited to around 3 μm, while copper may easily be pleated to much greater thicknesses. The thick plated copper structure provides much lower resistivity relative to materials employed in the past. The lower resistivity translates to greatly reduced, and therefore improved, series resistance for the integrated inductor. For example, comparing an inductor occupying the same area on a substrate, the series resistance can be reduced from 68 ohms for a 1 μm thick aluminum inductor, to 1.7 ohms for a 20 μm copper inductor.

Generally, according to the preferred embodiment, inductors are plated over a relatively thick dielectric layer above the top layer of circuit metallization of the electronic device. The dielectric layer minimizes the parasitics associated with underlying electronic devices. More particularly, a thicker dielectric layer is preferred in order to lower the capacitive coupling between the inductor and underlying devices.

The advantages of using thick copper versus thin aluminum, for example, as employed in the past, are clear from the examples that follow.

| THICKNESS (μm) | 1 | 3 | 10 | 20 |
|---|---|---|---|---|
| Aluminum | 3.4 | 1.1 | — | — |
| Copper | 2 | 0.7 | 0.2 | 0.1 |
| | DC Resistance (Ohms) | | | |

Spiral Inductor Line Width: 6 μm, spacing: 6 μm
Outside Dimension: 135 μm×135 μm
1.5 Turn Inductor, Inductance: 0.5 nH

| THICKNESS (μm) | 1 | 3 | 10 | 20 |
|---|---|---|---|---|
| Aluminum | 68 | 23 | — | — |
| Copper | 34 | 11 | 3.4 | 1.7 |
| | DC Resistance (Ohms) | | | |

Spiral Inductor Line Width: 6 μm, spacing: 6 μm
Outside Dimension: 410 μm×410 μμm
12 Turn Inductor, Inductance: 50 Hn One of ordinary skill will recognize that, given typically available substrates, an inductor Q value of 15 or greater will be achievable.

The copper thickness has some latitude, and can be optimized taking into account manufacturability issues such as the dependence on thickness of the photoresist during plating, and the ability to achieve the desired line thickness and spacing. Accordingly, there is some trade-off between minimizing spacing and maximizing thickness to achieve high inductance per area, and low series resistance. This trade-off will depend upon the particular application.

In copper plating, line height to width aspect ratios greater than one have been achieved. For example, given a 1:1 aspect ratio, an inductor could be designed requiring an area of 470 µm×470 µm, equaling 220,900 µm². To obtain the same inductance value with a 2:1 aspect ratio, an area of only 300 µm×300 µm, equaling 90,000 µm² would be required, resulting in a savings of 130,900 µm². For this discussed example, the inductance per area values are $95 \times 10^{-6}$ (nH/µm²) for a 1:1 aspect ratio, and $233 \times 10^{-6}$ (nH/µm²) for a 2:1 aspect ratio. The advantage of this approach is the capability to develop integrated circuits having integrated inductors that have lower parasitic capacitance to the substrate, lower series resistance, and higher inductance per unit area.

More particularly, with reference to the figures which illustrate the preferred embodiment, FIG. 1 is a simplified top view of a portion of an electronic device 10. Electronic device 10 may, for example, be a voltage controlled oscillator (VCO). Electronic device 10 includes copper integrated inductors 11 and 12. In the illustrated embodiment, inductors 11 and 12 are spiral inductors, but it will be recognized that other configurations could be suitable. Inductors 11 and 12 overlie the surface 15 of device 10.

Figure 2:
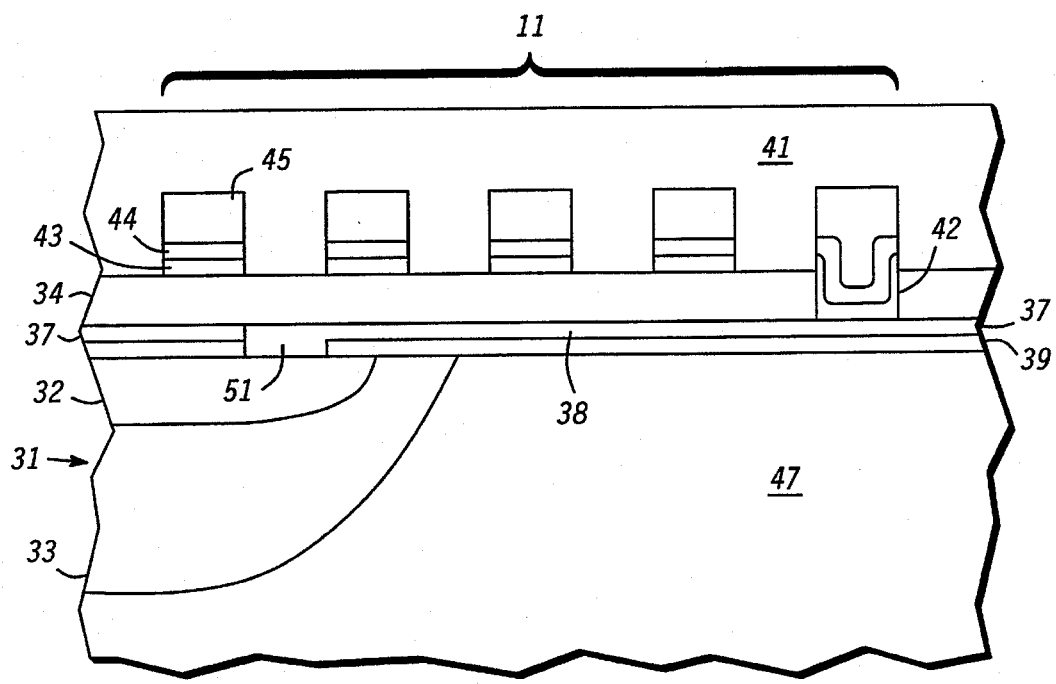
FIG. 2 is a simplified partial cross section of a portion of the electronic device of FIG. 1, further including a protective layer.

Inductors 11 and 12 are connected to electronic device portion 10 at two ports, typically at respective ends of the spiral. According to the embodiment illustrated, one port is connected through copper interconnect 13, which also overlies surface 15, and therefore is in the same plane as inductors 11 and 12. Referring briefly to FIG. 2, another port is connected through via 42, the via 42 extending from inductor 11 to buried interconnect layer 37. Buried interconnect layer 37, lying below surface 15, is used to couple underlying circuitry, as necessary to inductor 11.

The embodiment illustrated provides for inductor 12 of device 10 being contacted externally via contact pad 14. More specifically, contact pad 14 is coupled to copper interconnect 13, in the same plane as surface 15 of device 10. Contact Dad 14 is then available for external connection via for example, wire bonding. Other methods of coupling to the ports of inductor 11 and 12 will of course be recognized by those skilled in the art.

Referring to FIG. 2, FIG. 2 is a-simplified partial cross-sectional view of a portion of inductor 11, taken at 2—2 shown in FIG. 1. Additionally, FIG. 2 further includes protective layer 41, discussed in more detail below. FIG. 2 illustrates electronic device portion 30 which is a portion of the entire device 10. Electronic device portion 30 is formed in and on semiconductor substrate 47 according to well known semiconductor processing methods. Electronic device portion 30 includes P-type region 33 and shallow N-type region 32. Together, regions 32 and 33 form a solid state device, more particularly, a diode, 31, where N-type region 32 contacts P-type region 33. As will be explained in more detail below, diode 31 may be electrically coupled to other components of the electronic device, including inductor 11, via contact portion 51 of buried interconnect layer 37. Portion 51 provides convenient connection to N-type region 32 of diode 31. Similar connections, not shown, may be made to P-type region 33 of diode 31.

Subsequent to forming diode 31 in substrate 47, dielectric layer 39 is formed. A suitable material and thickness is $SiO_2$ of about 5000 Å. According to the preferred embodiment, dielectric layer 39 is deposited with chemical vapor deposition techniques, however, it will be recognized that a variety of techniques are available for forming such a dielectric layer. Subsequent to the deposition of layer 39, layer 39 is patterned and etched with well known processing methods in order to configure layer 39 for the particular application. For example, a via is opened to permit access from buried interconnect layer 37 to diode 31.

Above dielectric layer 39, buried metal interconnect layer 37 is deposited. In the preferred. embodiment, interconnect layer 37 comprises aluminum and is deposited using sputter depositions. It will be recognized that other methods of forming interconnect layer 37 are available. Interconnect layer 37 is patterned as necessary for any particular application with well known photolithographic techniques. Interconnect layer 37 provides connections to various active and passive devices comprising the overall electronic device.

In the preferred embodiment, a second dielectric layer 34 is deposited above metal interconnect layer 37. A suitable material is polyimide, having a thickness of 1 µm or greater. According to the preferred embodiment, well known spin-on techniques are used for applying dielectric layer 34.

Subsequent to forming second dielectric layer 34, via 42 is opened in layer 34 using well known photolithographic and etch techniques. Via 42 exposes interconnect layer 37, providing access for inductor 11 to interconnect layer 37, and thereby to diode 31.

One notable feature of the embodiment illustrated is that capacitive coupling from inductor 11 to the devices underlying dielectric layer 34, including diode 31, is reduced due to the presence of second dielectric layer 34. In the preferred embodiment, dielectric layer 34 should be greater than 1 µm.

A layer of metal 43 is formed above second dielectric layer 34. It will be understood, that as initially formed, layer 43 entirely covers the upper surface of the structure including any upper surfaces exposed by vias such as Via 42. In the preferred embodiment, layer 43 comprises titanium tungsten (TiW). A suitable thickness is about 500 Å. As will be recognized by those skilled in the art, TiW is used to provide adhesion and to provide a copper diffusion barrier. According to the preferred embodiment, TiW layer 43 is sputter deposited, contacting interconnect layer 37 at the base of via 42.

A sputtered copper layer 44 is deposited above TiW layer 43 to provide adhesion and a surface for plating the remainder of the copper comprising the inductors. A suitable thickness is about 1000 521 . It will be understood that many other metals and alloys may be employed in place of layers 43 and 44. Layer 44 is also deposited as a complete, unpatterned layer.

Subsequent to the deposition of sputtered copper layer 44, the structure is coated with photoresist (not shown). The thickness of the photoresist may be optimized to provide desired thicknesses for the line widths of inductor 11, depending upon the application. Examples of preferred thicknesses, line widths and inductor configurations are presented earlier in this specification, with accompanying Tables. Furthermore, well known methods for optimization are available for achieving the configurations and geometries discussed in detail and shown in the Tables in the preceding discussion. The photoresist is aligned, exposed, and developed, creating a pattern which defines the spiral inductor 11.

The patterned photoresist is used as a mask during the copper plating process, as is well known in the art. A relatively thick layer of plated copper 45 is subsequently electroplated on layer 44 which overlies the surface of the substrate. According to the preferred embodiment, the substrate is used as a cathode during the electroplating process. It will be recognized that the copper plates only where photoresist has been removed. Consequently, the copper is plated in the desired pattern, as defined by the photoresist, resulting in inductor 11.

Following the plating of copper layer 45, the photoresist used to define the pattern of the copper is removed, thereby exposing sputtered copper layer 44 between the lines of plated copper 45 that form inductor 11. Sputtered copper layer 44 is subsequently etched exposing TiW layer 43 which is then removed as well.

One notable feature of the process for forming the preferred inductor 11 is that plated copper layer 45 acts as an etch protect for the portions of sputtered copper Layer 44 and TiW layer 43 which underlie plated copper layer 45. Plated copper layer 45 is preferably more than ten times the thickness of sputtered copper layer 44. Consequently, etches well known in the industry that are capable of etching both plated and sputtered copper may be employed to etch down through sputtered copper layer 44 to achieve the spiral pattern of the inductor. When designing the inductor and fabrication flow, designers will readily be able to take into account the loss of a small portion of layer 45 during the etch of layer 44.

Alternatively,i and in some applications, preferably, an etching method may be employed which etches sputtered copper as fast or faster than plated copper. Such a method is disclosed in U.S. Pat. No. 5,409,567 which issued to Lytle, et al. on Apr. 25, 1995 and assigned to the same assignee, Motorola, Inc. Also, in applications where the thickness of plated copper 45 is critical, the top surface of plated copper layer 45 may be protected by an additional overlying layer of metal, for example, tin. The additional metal layer is applied before removing the photoresist which covers sputtered copper layer 44. Consequently, when the photoresist is removed, only plated copper layer 45, which already has the pattern of inductor 11, is covered with the extra layer of tin. An etchant appropriate for etching copper is then employed to etch sputtered layer 44. Subsequently, TiW layer 43 is similarly etched. Finally, the extra layer of tin atop plated copper layer 45 is removed.

In any event, in the embodiment illustrated, TiW layer 43 is etched after layer 44 is etched, thus completing the pattern of inductor 11.

Once inductor 11 is completely fabricated, an encapsulating material 41 may be deposited to provide physical and environmental protection for inductor 11 and all other components of electronic device 10. Preferred encapsulating materials include molding compound and polyimide.

The thick plated copper, narrow line widths and narrow spacing used in the preferred embodiment to make small area spiral inductors provide extremely low series resistance and good mutual inductance coupling for high inductance values. High inductance per area and low series resistance results in integrated inductors with high Q values. The ability to place the inductor over the electronic devices, resulting from the use of thicker dielectric layers, such as layer 34, between the inductor and underlying components, results in a smaller required area and therefore lower cost for the electronic device. Combining such integrated inductors on the same substrate with passive and/or active components making up the overall electronic device eliminates the need for extensive external interfaces which would be required if the inductors were not integrated. Resulting devices in accordance with the preferred embodiment of the present invention provide reduced system size, reduced parasitics, improved quality, lower power requirements and lower costs.

While specific embodiments of the present invention have been shown and described, further modifications and improvements will occur to those skilled in the art. It is understood that the invention is not limited to the particular forms shown and it is intended for the appended claims to cover all modifications which do not depart from the spirit and scope of this invention.

We claim:

1. A method of making an electronic device comprising:

providing a device substrate;

forming a solid state device in the device substrate;

forming an interconnect layer overlying the solid state device, the interconnect layer having interconnects;

forming a dielectric layer over the interconnect layer;

sputtering a sputtered titanium tungsten layer over the dielectric layer;

sputtering a sputtered copper layer over the sputtered titanium tungsten layer;

plating a plated copper layer over the sputtered copper layer; and forming a planar integrated inductor from the plated copper layer, the sputtered copper layer, and the sputtered titanium tungsten layer by concurrently etching the plated copper layer at a first rate and the sputtered copper layer at a second rate to expose the sputtered titanium tungsten layer, wherein the first rate is less than the second rate, and by etching the sputtered titanium tungsten layer.

2. The method according to claim 1, further using ammonium peroxydisulfate for concurrently etching the plated copper layer and the sputtered copper layer.

3. The method according to claim 1, further forming the planar integrated inductor overlying the solid state device.

4. The method according to claim 1, further using the interconnect layer for electrically coupling the planar integrated inductor to the solid state device.

5. The method according to claim 1, further providing polyimide for the dielectric layer.

6. The method according to claim 1, further providing aluminum for the interconnect layer.

7. A method of making an electronic device comprising:

providing a substrate having a semiconductor device;

depositing a dielectric layer over the substrate;

providing a metal layer over the dielectric layer;

providing a first copper layer over the metal layer;

patterning a photoresist layer over a first portion of the first copper layer while exposing a second portion of the first copper layer;

providing a second copper layer over the second portion of the first copper layer; 'etching the first copper layer at a first rate while etching the second copper layer at a second rate, wherein the first rate is greater than the second rate; and etching the metal layer, wherein etching the first copper layer and etching the metal layer defines a passive component.

8. The method according to claim 7, further providing polyimide for the dielectric layer, titanium tungsten for the metal layer, sputtered copper for the first copper layer, and plated copper for the second copper layer.

9. The method according to claim 7, further providing ammonium peroxydisulfate for etching the first copper layer while etching the second copper layer.

10. The method according to claim 7, further providing a planar spiral inductor for the passive component.

11. The method according to claim 7, further defining the passive component over the semiconductor device.

12. The method according to claim 7, further electrically coupling the passive component to the semiconductor device.

13. The method according to claim 7, further providing a protective layer over the second copper layer.

14. A method of making an electronic device having an inductor, comprising:

providing a semiconductor substrate;

forming a semiconductor device in the semiconductor substrate;

providing a copper diffusion barrier over the semiconductor substrate; 'depositing a sputtered copper layer over the copper diffusion barrier;

patterning a plated copper layer over a first portion of the sputtered copper layer while leaving a second portion of the sputtered copper layer exposed;

concurrently etching the second portion of the sputtered copper layer at a first rate while etching the plated copper layer at a second rate to expose a portion of the copper diffusion barrier, wherein the first rate is greater than the second rate; and etching the portion of the copper diffusion barrier, wherein an inductor is defined by etching the second portion of the sputtered copper layer and etching the portion of the copper diffusion barrier.

15. The method according to claim 14, further providing ammonium peroxydisulfate for concurrently etching the second portion of the sputtered copper layer while etching the plated copper layer.

16. The method according to claim 14, further providing the inductor overlaying the semiconductor device and electrically coupling the inductor and the semiconductor device.

17. The method according to claim 14, further providing titanium tungsten for the copper diffusion barrier.

* * * * *

UNITED STATES PATENT AND TRADEMARK OFFICE
CERTIFICATE OF CORRECTION

PATENT NO. : 5,478,773
DATED : December 26, 1995
INVENTOR(S) : Stephen Dow
Eric C. Maass
Bill Marlin It is certified that error appears in the above-indentified patent and that said Letters Patent is hereby corrected as shown below:

Claim 7, column 6, line 47
Delete "'" before "etching".
"etching" should be a new paragraph.

Claim 14, column 7, line 12
Delete "'" before "depositing".
"depositing" should be a new paragraph.

Signed and Sealed this

Fourteenth Day of October, 1997

Attest:

Attesting Officer

BRUCE LEHMAN

Commissioner of Patents and Trademarks